US006825249B1

(12) United States Patent
Takeda et al.

(10) Patent No.: US 6,825,249 B1
(45) Date of Patent: Nov. 30, 2004

(54) LAMINATING METHOD OF FILM-SHAPED ORGANIC DIE-BONDING MATERIAL, DIE-BONDING METHOD, LAMINATING MACHINE AND DIE-BONDING APPARATUS, SEMICONDUCTOR DEVICE, AND FABRICATION PROCESS OF SEMICONDUCTOR DEVICE

(75) Inventors: Shinji Takeda, Tsukuba (JP); Takashi Masuko, Tsukuba (JP); Masami Yusa, Shimodate (JP); Yasuo Miyadera, Tsukuba (JP); Mituo Yamasaki, Takahagi (JP); Iwao Maekawa, Hitachi (JP); Akio Kotato, Mito (JP); Yuusuke Miyamae, Hitachi (JP); Tadaji Satou, Takahagi (JP); Makoto Saitou, Hitachi (JP); Tooru Kikuchi, Hitachi (JP); Akira Kageyama, Niiza (JP); Aizou Kaneda, Yokohama (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 178 days.

(21) Appl. No.: 09/616,943

(22) Filed: Jul. 14, 2000

Related U.S. Application Data

(63) Continuation of application No. 08/875,330, filed as application No. PCT/JP95/02691 on Dec. 26, 1995, now Pat. No. 6,099,678.

(30) Foreign Application Priority Data

Dec. 26, 1994 (JP) ............................................ 6-322779
Apr. 28, 1995 (JP) ............................................ 7-106016
Jul. 10, 1995 (JP) ............................................ 7-173493

(51) Int. Cl.[7] ............................................... C08K 3/00
(52) U.S. Cl. ........................ 523/218; 524/439; 524/440
(58) Field of Search ........................ 523/218; 524/439, 524/440

(56) References Cited

U.S. PATENT DOCUMENTS

| | | | |
|---|---|---|---|
| 3,608,054 A | * | 9/1971 | Alvine ........................ 264/309 |
| 4,358,581 A | | 11/1982 | Sutton, Jr. |
| 4,460,718 A | * | 7/1984 | Tanaka et al. .............. 523/400 |
| 4,581,096 A | | 4/1986 | Sato |
| 4,604,230 A | * | 8/1986 | Goswami et al. ........... 252/514 |
| 4,656,238 A | | 4/1987 | Kunimune et al. |
| 4,755,415 A | * | 7/1988 | Iijima et al. ................ 428/163 |
| 4,875,279 A | | 10/1989 | Sakiadis |
| 4,933,219 A | | 6/1990 | Sakumoto et al. |
| 4,965,331 A | | 10/1990 | Jackson et al. |
| 4,985,105 A | | 1/1991 | Masuda |
| 5,141,050 A | | 8/1992 | Schuft |
| 5,145,099 A | | 9/1992 | Wood et al. |
| 5,177,032 A | | 1/1993 | Fogal et al. |
| 5,204,399 A | | 4/1993 | Edelman |
| 5,234,522 A | | 8/1993 | Suzuki et al. |
| 5,238,730 A | | 8/1993 | Hanawa et al. |
| 5,250,637 A | | 10/1993 | Shiobara et al. |
| 5,277,972 A | | 1/1994 | Sakumoto et al. |
| 5,296,567 A | | 3/1994 | Baumann et al. |
| 5,319,005 A | | 6/1994 | Hagiwara et al. |
| 5,360,942 A | | 11/1994 | Hoffman et al. |
| 5,406,124 A | | 4/1995 | Morita et al. |
| 5,432,380 A | | 7/1995 | Jin et al. |
| 5,476,908 A | | 12/1995 | Kishi et al. |
| 5,512,628 A | | 4/1996 | Sakumoto et al. |
| 5,528,075 A | | 6/1996 | Burns |
| 5,605,763 A | | 2/1997 | Yusa et al. |
| 5,635,009 A | | 6/1997 | Kawamura et al. |
| 5,659,004 A | | 8/1997 | Takigawa et al. |
| 5,667,899 A | | 9/1997 | Yusa et al. |
| 5,698,891 A | | 12/1997 | Tomita et al. |
| 5,728,473 A | | 3/1998 | Inoue et al. |
| 5,793,099 A | | 8/1998 | Murakami et al. |
| 5,827,908 A | | 10/1998 | Arai et al. |
| 5,837,368 A | | 11/1998 | Hiroe et al. |
| 5,985,458 A | * | 11/1999 | Angelopoulos et al. ..... 428/418 |
| 5,989,459 A | * | 11/1999 | Nguyen et al. ............. 252/503 |
| 6,046,072 A | | 4/2000 | Matsuura et al. |
| 6,201,945 B1 | * | 3/2001 | Schlueter .................... 399/329 |
| 6,248,613 B1 | | 6/2001 | Matsuura et al. |
| 6,372,080 B1 | | 4/2002 | Matsuura et al. |
| 2001/0015484 A1 | | 8/2001 | Matsuura et al. |

FOREIGN PATENT DOCUMENTS

| | | |
|---|---|---|
| EP | 0 271 736 A1 | 6/1988 |
| EP | 0 285051 A2 | 10/1988 |

(List continued on next page.)

OTHER PUBLICATIONS

Y. Sakamoto et al., "New Type Film–Adhesives for Microelectronics Application," 92 Proceedings of 42nd Electronic Components & Technology Conference, May 18–20, 1992 (New York: The Institute of Electrical and Electronics Engineers, Inc., 1992): pp. 215–218.

(List continued on next page.)

*Primary Examiner*—Edward J. Cain
(74) *Attorney, Agent, or Firm*—Griffin & Szipl, P.C.

(57) ABSTRACT

Provided are a laminating method and machine for successively heating and compression-bonding a film-shaped organic die-bonding material on a leadframe.

leadframe 7 is placed on a travelling table 8 and is heated there. A film-shaped organic die-bonding material 2 is punched out and the resulting film is tack-bonded to a die pad on the leadframe. The leadframe with the film tack-bonded thereon is then moved to a position B by the travelling table. After the film is pressed by a compression-bonding element at the position B, a chip is mounted on the film-shaped organic die-bonding material 2.

It is therefore possible to bond a film-shaped organic die-bonding material under compression on a leadframe with good productivity but without voids and further to avoid package cracking upon mounting a chip.

16 Claims, 7 Drawing Sheets

FOREIGN PATENT DOCUMENTS

| | | |
|---|---|---|
| EP | 0 618 614 A2 | 10/1994 |
| EP | 0 775 716 A1 | 5/1997 |
| EP | 0 837 498 A1 | 4/1998 |
| JP | A-54-12266 | 1/1979 |
| JP | 54-12266 | 1/1979 |
| JP | 54-138371 | 10/1979 |
| JP | A-54-138371 | 10/1979 |
| JP | 58-57730 | 4/1983 |
| JP | 58-222530 | 12/1983 |
| JP | 60-145630 A | 8/1985 |
| JP | 60-145630 | 8/1985 |
| JP | 60-38825 | 4/1986 |
| JP | 62-141038 | 9/1987 |
| JP | 63-289822 | 11/1988 |
| JP | S64-9226 A | 1/1989 |
| JP | 64-22744 | 2/1989 |
| JP | 1-165635 | 11/1989 |
| JP | H2-168636 A | 6/1990 |
| JP | 61-19735 | 6/1990 |
| JP | H2-246125 A | 10/1990 |
| JP | 2-256251 | 10/1990 |
| JP | 02-256251 A | 10/1990 |
| JP | A-2-256251 | 10/1990 |
| JP | 3-228 | 1/1991 |
| JP | 4-3438 | 1/1992 |
| JP | 04-227782 A | 8/1992 |
| JP | H5-117596 A | 5/1993 |
| JP | 5-125337 | 5/1993 |
| JP | H5-152355 A | 6/1993 |
| JP | 5-152386 | 6/1993 |
| JP | 5-190022 | 7/1993 |
| JP | 5-218107 | 8/1993 |
| JP | 5-152466 | 10/1993 |
| JP | H5-331424 A | 12/1993 |
| JP | 5-331424 | 12/1993 |
| JP | H5-331425 A | 12/1993 |
| JP | 5-335379 | 12/1993 |
| JP | 06-104300 A | 4/1994 |
| JP | 6-104300 | 4/1994 |
| JP | 6-145639 | 5/1994 |
| JP | H6-151478 A | 5/1994 |
| JP | H6-172714 A | 6/1994 |
| JP | 6-204264 | 7/1994 |
| JP | H6-218880 A | 8/1994 |
| JP | 6-218880 | 8/1994 |
| JP | H6-248241 A | 9/1994 |
| JP | H6-256733 A | 9/1994 |
| JP | H6-264035 A | 9/1994 |
| JP | 6-264035 | 9/1994 |
| JP | 06-326240 A | 11/1994 |
| JP | H7-22441 A | 1/1995 |
| JP | 7-90239 | 4/1995 |
| JP | H7-90244 A | 4/1995 |
| JP | H7-171154 | 7/1995 |
| JP | H7-242820 A | 9/1995 |
| JP | 3117966 B2 | 10/2000 |
| JP | 3117971 | 10/2000 |
| JP | 3117971 B2 | 10/2000 |
| JP | 3117972 B2 | 10/2000 |
| JP | 3215014 | 7/2001 |
| WO | WO 94/21744 | 9/1994 |

OTHER PUBLICATIONS

Osaka City Industrial Research Institute et al. ed., Table: List of Properties of Major Thermosetting and Thermoplastic Resins, Plastic Reader 15th Edition (Japan: Plastic Age, Inc., 1987).

Shinji Takeda et al., "Die Bonding Adhesive Film," Hitachi Chemical Technical Report No. 24 (Jan. 1995) (Tokyo: Hitachi Chemical Co. Ltd.).

Fig. 1 (Water absorption (volume %), Saturation moisture absorption).

Surface Energy, p. 538, Chemical Dictionary 7, Kyoritsu Publishing Co.

Thermodynamic equibrium of wetting, p. 1235, Chemical Handbook Applied Chemistry II, Oct. 15, 1986, Maruzen Co.

Japanese Appln. No. 2000–346979—Notice of Reason for Refusal mailed on Oct. 22, 2002 together with English Translation (Refs. X–AH Related).

References cited in an opposition in Japanese Patent No. 3215014 (Refs. AI–AT and AU–AW and AZ).

"Rubber Elastomer Utility Notes", relates to types of rubber and their chemical structure and properties, Jul. 20, 1991.

Opposition raised against Japanese Patent No. 3187400.

* cited by examiner

A					B

LAMINATING METHOD OF FILM-SHAPED ORGANIC DIE-BONDING MATERIAL, DIE-BONDING METHOD, LAMINATING MACHINE AND DIE-BONDING APPARATUS, SEMICONDUCTOR DEVICE, AND FABRICATION PROCESS OF SEMICONDUCTOR DEVICE

The present application is a continuation of patent application Ser. No. 08/875,330, filed Jun. 25, 1997, now U.S. Pat. No. 6,099,678 which is a 371 of PCT/JP95/02691 filed Dec. 26, 1995.

TECHNICAL FIELD

This invention relates to a laminating method of a film-shaped organic die-bonding material, a die-bonding method, a laminating machine and a die-bonding apparatus for the bonding of a semiconductor element (hereinafter referred to as "chip") onto a support member such as a leadframe using the film-shaped organic die-bonding material.

BACKGROUND ART

As a method for bonding a chip on a leadframe, it has heretofore been the practice to feed a die-bonding material onto the leadframe and then to bond the chip onto the leadframe. As such die-bonding materials, Au—Si eutectic, solders, resin pastes and the like are known, for example. Among these, Au—Si eutectic has the problems that it is costly and has a high modulus of elasticity and requires vibrations at portions to be bonded. Solders involve the problems that they cannot withstand temperatures equal to and higher than their melting point and they have a high modulus of elasticity. Of resin pastes, silver paste is most common. Compared with other materials, silver paste is most inexpensive and has high heat-resistant reliability and a low modulus of elasticity, which means that silver paste is used most often as a bonding material for IC and LSI leadframes.

Reflecting the high densification and the move toward larger chips in recent years, it has however become increasingly difficult to evenly coat silver paste over an entire surface upon bonding. Unless resin paste can be coated evenly, voids occur in bonded parts and upon mounting, they cause package cracking during the course of soldering heat treatment. Occurrence of such voids has therefore become a problem.

Further, there has been an ever-increasing demand in recent years for high-density mounting to meet the move toward smaller and/or thinner electronic equipment. Replacing semiconductor packages of the conventional pin insertion type, surface-mount semiconductor packages suited for high-density mounting have come into mainstream use.

In the case of a surface-mount package, leads are directly soldered to a printed circuit board or the like. Therefore, using infrared reflowing, vapor phase reflowing, solder dipping or the like as a heating method, the package is heated in its entirety and is then mounted.

Here, the entire package is exposed to temperatures as high as 210 to 260° C. If moisture exists inside the package, package cracking (hereinafter called "reflow cracking") occurs as a result of explosive vaporization of the moisture.

This reflow cracking significantly reduces the reliability of the semiconductor package to the extent that it has become a serious problem and the subject of technical attention.

The following is the mechanism of the occurrence of reflow cracking caused by a die-bonding material. In a semiconductor package, (1) the die-bonding material absorbs moisture during storage, (2) upon mounting the package by reflow soldering, the moisture is vaporized by heat, (3) destruction or separation of the die-bonding layer takes place due to the resulting vapor pressure, and (4) reflow cracking then occurs.

Under the current circumstances whereby sealing materials have been increasingly improved in reflow cracking resistance, reflow cracking which is caused by a die-bonding material has become a serious problem, especially in thin packages, leading to a strong demand for the improvement of reflow cracking resistance.

DISCLOSURE OF THE INVENTION

An object of the present invention is to provide a laminating method, a die-bonding method, a laminating machine and a die-bonding apparatus, which make it possible to fabricate, with good productivity, semiconductor packages which are free from package cracking and have excellent reliability.

Another object of the present invention is to provide a semiconductor device, which makes use of a film-shaped organic die-bonding material, is free from reflow cracking and has excellent reliability, and a fabrication process thereof.

In the present invention, a film-shaped organic die-bonding material is used. This is in the form of a film made primarily of an organic material such as an epoxy resin, silicone resin, acrylic resin or polyimide resin (including an organic material added with a metallic filler or an inorganic filler). On a support member such as a leadframe, the film-shaped organic die-boding material is compression-bonded in a heated state. Further, a chip is placed on the film-shaped organic die-bonding material, followed by heating and compression-bonding. Namely, a die-bonding material is evenly applied to a part, which is to be bonded, by forming a resin paste into a film. Such a film-shaped organic die-bonding material requires application of pressure so that the film-shaped die-bonding material is reliably provided with wettability to the chip and leadframe.

A film-shaped organic die-bonding material useful in the present invention can be produced, for example, by dissolving or dispersing an organic material such as a polyimide or epoxy resin and optionally, a material, for example, an additive such as a metallic filler in an organic solvent to form a coating varnish, coating the coating varnish onto a carrier film such as a biaxially-stretched polypropylene film, causing the solvent to evaporate to form a layer and then peeling off the layer from the carrier film. One side of the layer, the side having been in contact with the air in a drying step in which the solvent was caused to evaporate (i.e., the side being a side opposite to a side where the layer was in contact with the carrier film), will be referred to as the "side A", while the side at which the layer was in contact with the carrier film will be referred to as the "side B".

This invention provides a laminating method, die-bonding method, laminating machine and die-bonding apparatus for a film-shaped organic die-boding material, which are free from voids and feature good productivity and which are useful for applying the film-shaped organic die-bonding material to an actual assembly step for semiconductor devices.

The laminating method according to the present invention for a film-shaped organic die-bonding material comprises mounting and tack-bonding a film-shaped organic die-bonding material of a predetermined size on a chip-mounting support member at a predetermined position thereof and then pressing the die-bonding material against the support member, whereby the die-bonding material is compression-bonded on the support member.

The die-bonding method according to the present invention comprises mounting and tack-bonding a film-shaped organic die-bonding material of a predetermined size on a chip-mounting support member at a predetermined position thereof and then pressing the die-bonding material against the support member and compression-bonding the die-bonding material on the support member, thereby laminating the film-shaped organic die-bonding material of the predetermined size on the chip-mounting support member at the predetermined position thereof; and heating a chip and compression-bonding the chip on the film-shaped organic die-bonding material at a predetermined position thereof, the die-bonding material being located on the support member.

A first laminating machine according to the present invention comprises a feeder for feeding a film-shaped organic die-bonding material over a predetermined constant length, a punching device for punching out the film-shaped organic die-bonding material, a film tack-bonding device for placing and tack-bonding the punched-out film-shaped organic die-bonding material on the support member, and a film compression-bonding device for pressing the tack-bonded film-shaped organic die-bonding material against the support member so that the tack-bonded film-shaped organic die-bonding material is compression-bonded on the support member.

A second laminating machine according to the present invention comprises a feeder for feeding a film-shaped organic die-bonding material over a predetermined constant length, a cutter for cutting out the film-shaped organic die-bonding material, a film tack-bonding device for placing and tack-bonding the cut-out film-shaped organic die-bonding material on the support member at a predetermined position thereof, and a film compression-bonding device for pressing the tack-bonded film-shaped organic die-bonding material against the support member so that the tack-bonded film-shaped organic die-bonding material is compression-bonded on the support member.

The die-bonding apparatus according to the present invention comprises the above-described first or second laminating machine and a chip compression-bonding machine for heating a chip and compression-bonding the chip on a film-shaped organic die-bonding material at a predetermined position thereof, the die-bonding material being located on a support member.

An apparatus according to the present invention is constucted of a film feed-take-up unit for feeding a film-shaped organic die-bonding material over a predetermined constant length, a punching unit for accurately punching out the film-shaped organic die-bonding material, a provisional compression-bonding unit for provisionally compression-bonding the punched-out film-shaped organic die-bonding material on a leadframe (a film tack-bonding device for placing and tack-bonding the film-shaped organic die-bonding material on a support member at a predetermined position thereof), and a permanent compression-bonding unit for performing heating and compression-bonding subsequent to the provisional compression-bonding (a film compression-bonding device for pressing the tack-bonded film-shaped organic die-bonding material against the support member so that the die-bonding material is compression-bonded on the support member). As the film-shaped organic die-bonding material is supplied in a reeled form, the film feed-take-up unit is constructed of a mechanism for feeding the film from the reel and a mechanism for taking up the punched-out, remaining film. The punching unit is constructed of a die-punch mechanism for punching out the film. The provisional compression-bonding unit is constructed of a mechanism for holding the punched-out film-shaped organic die-bonding material on the leadframe at the predetermined position and tack-bonding it there (for placing the film-shaped organic die-bonding material on the support member at the predetermined position thereof and tack-bonding it there). The permanent compression-bonding unit is constructed of means for heating the leadframe and/or the film-shaped organic die-bonding material and a mechanism for permanently compression-bonding the film (for pressing the film-shaped organic die-bonding material against the support member and compression-bonding it there). Incidentally, these mechanisms and means may be arranged as an integrated apparatus. This means, for example, that the film punch could also act as a compression-bonding element for performing provisional compression-bonding. It is not particularly necessary to separate the mechanisms and means from one another insofar as the individual functions can be achieved.

A description will now be made with reference to FIGS. 1 to 4. At the film feed unit, a film-shaped organic die-bonding material (hereinafter abbreviated as the "film" in the description to be made with reference to FIGS. 1 to 4) 2 which has been supplied from a reel 1 is controlled so as to extend under a predetermined tension by a constant tension roller 10, a guide roller 12 and a feed roller 13, is intermittently fed at predetermined constant step pitches to pass through the punching unit, and is wound up on a take-up reel 3. The constant tension roller 10 can be constructed of an adjusting mechanism, which can control the tension of the film, and a powder brake, friction brake or the like, although it is not limited to such a construction. The feed roller 11 can be driven by a stepper motor or the like, which permits intermittent feeding of the film at predetermined constant step pitches, although the drive means for the feed roller is not limited thereto. The take-up reel 3 winds up the film which has been fed by the feed roller. As an appropriate tension upon feeding the film, a tension in a range of from 0.05 to 10 MPa is preferred. A tension lower than 0.05 MPa may result in slackness of on the film, thereby causing an offset in a transverse direction or a punching error. On the other hand, a tension higher than 10 MPa may stretch the film, so that a punching error may arise or, as the thickness of the film may become uneven due to its elongation, voids tend to occur. Further, the film will be broken if the tension exceeds the breaking strength of the film after its punching.

At the punching unit, the film 2 is punched out into a predetermined shape at the position of a die 6 when a punch 4 descends. It is preferred to adjust the tension of the film to 0.05 to 10 MPa before the film is punched out. A tension lower than 0.05 MPa is insufficient and may lower the accuracy at the time of punching. A tension higher than 10 MPa, on the other hand, may cause a deformation due to elongation of the film, so that the thickness of the film may become uneven and voids tend to occur.

The film 2 is held in place by a fixing punch 5 as needed. The punch 4 is provided with film suction-holding such as vacuum suction means. Owing to the provision of this means, the punched-out film is held under suction on the punch 4. It is preferred to provide two or more vacuum suction ports as the film suction-holding means, because use of only one vacuum suction port cannot hold the film still, leading to a reduction in positional accuracy. The size of each vacuum suction port may preferably be 2 mm or smaller in diameter. A diameter greater than 2 mm tends to leave a mark of the port on the film and also to form voids. At the provisional compression-bonding unit, a travelling table 8 with a leadframe 7 held thereon at a predetermined position thereof is kept stopped at a position A. After punching, the punch 4 with the film held thereon descends further to provisionally bond the film under compression on the leadframe. Provisional compression-bonding is performed as many times as needed in accordance with the number of patterns on the leadframe. A plan view of the leadframe is shown in FIG. 2.

Next, the travelling table is caused to move to a position B in the permanent compression-bonding unit. A heating unit is built in the travelling table to heat the leadframe at a predetermined temperature. Each film which has been provisionally compression-bonded on the leadframe is degasified and at the same time, permanently compression-bonded by a compression-bonding element 9 at the position B. To efficiently perform the degasification and the heating and compression-bonding, a surface of the compression-bonding element is preferably formed of a heat-resistant elastic piece, because the degasification cannot be achieved efficiently unless such an elastic piece is used. Further, it is preferred to configure the elastic piece so that its cross-sectional shape before compression-bonding centrally defines a curved convex surface, since the formation of the curved convex surface at the center makes it possible to carry out compression-bonding from the center so that each film can be compression-bonded without voids.

Examples of compression-bonding elements, which are each provided with such a curved convex surface, are shown in FIG. 3 and FIG. 4, respectively. In FIG. 3, an elastic piece 14 with a surface machined in a convex form is fixedly secured on a free end face of a compression-bonding element main body. In FIG. 4, a strip-shaped elastic piece 14 of a uniform thickness is fixedly secured extending from side walls of a compression-bonding element main body. Designated at numeral 15 is a fixing metal fitting. The compression-bonding element in FIG. 4 is constructed of the compression-bonding element main body having a smooth end face and the strip-shaped elastic piece covering a free end portion of the compression-bonding element main body. The strip-shaped elastic piece is pressed by the smooth end face of the core. The smooth end face of the compression-bonding element main body preferably has a profile irregularity of not greater than 15 $\mu$m in terms of center line average height. Profile irregularity greater than 15 $\mu$m in terms of center line average height may result in transfer of the ruggedness of the free end face of the compression-bonding element main body through the elastic piece so that voids may occur in some instances.

The Young's modulus of the elastic piece may preferably range from 0.2 to 50 MPa. A Young's modulus smaller than 0.2 MPa leads to an unduly soft elastic piece that may not fully press out voids. A Young's modulus greater than 50 MPa results in an excessively hard elastic piece that likewise may not fully press out voids. Usable for the elastic piece are rubbers such as silicone rubber, fluorine rubber, isobutylene-isoprene rubber and nitrile-butadiene rubber; plastic-modified rubbers each obtained by modifying with a plastic to control the modulus of elasticity; rubber-modified plastics each obtained by modifying with a rubber to control the modulus of elasticity; and the like. Other elastomers may also be used insofar as they are equipped with sufficient heat resistance. The elastic piece may preferably have surface smoothness not greater than 10 $\mu$m in terms of center line average height. Surface smoothness greater than 10 $\mu$m tends to result in the occurrence of voids.

As compression-bonding conditions for films, it is preferred to set the heating temperature and the compression-bonding force at 80 to 300° C. and 0.03 to 2 MPa, respectively, so that necessary bonding strength can be obtained without allowing voids to remain. A heating temperature lower than 80° C. may not permit successful heating and compression-bonding, while a heating temperature higher than 300° C. is too high, and heating and compression-bonding cannot be performed well. Further, a compression-bonding force lower than 0.03 MPa is so low that voids may remain, while a compression-bonding force higher than 2 MPa is so high that the films may be deformed.

The leadframe with the film bonded thereon is passed to the next step, where a semiconductor element (chip) is heated, compression-bonded and then hardened so that the chip is firmly bonded. To perform this step, the same method as that commonly practiced using a resin paste can be adopted.

FIGS. 5 to 10 illustrate another apparatus according to the present invention, in which FIG. 5 is a front view, FIG. 6 is a plan view, FIG. 7 is a simplified plan view of a frame transporting rail unit, FIG. 8 is a simplified cross-sectional view of a feeder and a cutter, FIG. 9 is a simplified cross-sectional view of a film compression-bonding device for evenly pressing a film-shaped organic die-bonding material, and FIG. 10 is a plan view of a leadframe.

In FIGS. 5 through 10, there are shown a reel 21 of a film-shaped organic die-bonding material (hereinafter abbreviated as the "film"), a film-feeding pinch roller 22, a film-holding cylinder 23, a film-cutting cylinder 24, a frame-transporting actuator 25, frame-transporting rails 26, a film suction-holding pad feed cylinder 27, a preheater 28, a film-heating and bonding unit 29, a chip-heating and bonding unit 30, a heating and compression-bonding unit 31, a compression-bonded portion positioning device 32, a chip tray 33, a film suction-holding pad 34, a chip-bonding device 35, a film 36, a cutter 37, a heater block 38a for preheating each leadframe, a heater block 38b for heating and compression-bonding a film on each leadframe, a heater block 38c for heating and compression-bonding a chip on each film, a heater block 38d for heating each heated and compression-bonded chip again to achieve its permanent compression-bonding, a leadframe 39, a roller 40, and die pads 41 of the leadframe.

The film-shaped organic die-bonding material (film) is cut into a predetermined size by the cutter. The accuracy of machining steps such as cutting has been confirmed to be within ±200 $\mu$m. If the cutting accuracy is lower than this level and the film is cut larger than the chip, the film is oversized and has a protrusion which becomes a starting point for the occurrence of cracks. A smaller film, on the other hand, results in reduced bonding properties.

The heater block (38a), which is provided to preheat the leadframe in the present invention, can heat the leadframe to an intended temperature in a short time when the leadframe has been moved to the heater block (38b) which serves to heat and bond the film-shaped organic die-bonding material under compression. In the present invention, the heater block (38a) for preheating the leadframe, the heater block (38b) for heating and compression-bonding the film-shaped organic die-bonding material on the leadframe, the heater block (38*c*) for heating and compression-bonding the chip on the film-shaped organic die-bonding material and the heater block (38*d*) for heating the heated and compression-bonded chip again and permanently compression-bonding the chip, the heater blocks being independently adjustable in temperature, can be independently set at different temperatures, whereby the film-shaped organic die-bonding material can be bonded under optimal temperature conditions.

The film compression-bonding device for evenly pressing the tack-bonded, film-shaped organic die-bonding material in the present invention, such as a roller device or the like, can prevent inclusion of bubbles or voids in a layer of the die-bonding material when the chip is bonded on the support member such as the leadframe, thereby making it possible to obtain uniform bonding properties of high reliability.

Preferred examples of the film compression-bonding device include rollers made of a metal, such as stainless steel, or TEFLON, and planar elastic bodies made of silicone rubber or the like. As the silicone rubber, heat-resistant silicone rubber of JIS-A 40 to 80 degrees in terms of the JIS hardness is preferred, with heat-resistant silicone rubber of JIS-A 45 to 55 degrees being more preferred.

The surface smoothness of the compression-bonding portion of the film compression-bonding device is important. It may not be greater than 10 μm in terms of center line average height. It has been found that a value greater than this level may result in transfer of the ruggedness of the compression-bonding device onto the film and hence in reduced bonding properties.

A load, at which the film placed on the support member such as the leadframe is compression-bonded by the permanent film compression-bonding device, may range from 50 g to 3000 g. A compression-bonding load lower than 50 g may lead to deteriorated bonding properties whereas a compression-bonding load higher than 3000 g may result in a distorted leadframe. A compression-bonding load outside the above range is therefore not preferred.

A temperature, at which the film-shaped die-bonding material (film) is compression-bonded on the support member such as the leadframe, is not lower than a glass transition temperature Tg (an α relaxation peak temperature in the measurement of kinematic viscoelasticity) of the film but not higher than a thermal decomposition temperature (a temperature at which a weight reduction begins to take place in a thermogravimetric analysis) of the film. A film compression-bonding temperature lower than Tg may result in a reduction in bonding properties whereas a film compression-bonding temperature higher than the thermal decomposition temperature may cause thermal decomposition of the film so that bonding properties may be reduced. A film compression-bonding temperature outside the above range is therefore not preferred.

A temperature, at which the chip is bonded to the film compression-bonded on the support member such as the leadframe, may be equal to or higher than Tg+70° C. but not higher than the thermal decomposition temperature. If the bonding temperature of the chip is lower than Tg+70° C., the bonding properties may be reduced. If the bonding temperature exceeds the thermal decomposition temperature, the film may undergo thermal decomposition so that the bonding properties may be reduced. A bonding temperature outside the above range is therefore not preferred.

The die-bonding apparatus according to the present invention may be preferably provided with a feeder for feeding a film-shaped organic die-bonding material over a predetermined constant length; a cutter for cutting out the film-shaped organic die-bonding material; a film tack-bonding device for suction-holding the film-shaped organic die-bonding material that has been cut out and heating and compression-bonding it on a leadframe, which has been preheated on a heater block, at a predetermined position thereof; a film compression-bonding device for eventually pressing the tack-bonded, film-shaped organic die-bonding material; a chip tack-compression-bonding device for heating and tack-bonding a chip on the film-shaped organic die-bonding material at a predetermined position thereof, the die-bonding material having been bonded on the leadframe heated on the heater block; and a chip, permanent compression-bonding device for heating the film-shaped organic die-bonding material, which has been bonded on the leadframe, and the chip again while heating them, and permanently compression-bonding the die-bonding material and the chip together.

The present invention has been described above with respect to the formation of the film-shaped organic die-bonding material of the predetermined size by the punching device or the cutter. It is to be noted, however, with respect to the method and device for placing and tack-bonding the film-shaped organic die-bonding material of the predetermined size on the chip-mounting support member at the predetermined position thereof and the method and device for pressing the film-shaped organic bonding martial against the support member and compression-bonding it there, that those described in association with the use of the punching device can be used likewise in the use of the cutter, and that those described in association with the use of the cutter can be employed similarly in the use of the punching device.

A semiconductor device can be fabricated by mounting a chip on a support member in accordance with the laminating method, die-bonding method, laminating machine or die-bonding apparatus of the present invention and conducting further steps employed for the fabrication of general semiconductor devices, such as wire-bonding and resin sealing of the chip.

FIG. 11 illustrates one example of a process according to the present invention for the fabrication of a semiconductor device.

A film-shaped organic die-bonding material 101 is unrolled and is cut into a predetermined size by a cutter 102 (FIG. 11(*a*)).

The film-shaped organic die-bonding material 101 is compression-bonded by a compression-bonding element 104 on a die pad 106 of a leadframe 105 on a heating platen 107 in accordance with the laminating method of the present invention (FIG. 11 (*b*)). As compression-bonding conditions, it is preferred to set the temperature at 100 to 250° C., the time at 0.1 to 20 seconds and the pressure at 100 to 5000 g.

A chip 108 is placed on the film-shaped organic die-bonding material 101 bonded on the die pad 106 and is then heated and compression-bonded (die-bonded) (FIG. 11(*c*)). As die-bonding conditions, it is preferred to set the temperature at 150 to 350° C., the time at 0.1 to 20 seconds and the pressure at 10 to 3000 g.

The process then proceeds through a wire-bonding step (FIG. 11(*d*)) and a resin-sealing step for the chip (FIG. 11(*e*)), whereby the semiconductor device is fabricated. Designated at numeral 109 is a sealing resin.

In the present invention, examples of the support member on which the film-shaped organic die-bonding material is compression-bonded can include a die pad of a leadframe, and a chip mount of a padless leadframe portion (LOC), a ceramics-made printed board, a glass-epoxy printed board or a glass-polyimide printed board.

As the film-shaped organic die-bonding material, the description has been given of those having a single layer structure. In the present invention, those having a multi-layer structure such as a two-layer or three-layer structure can also be used.

A film-shaped organic die-bonding material can be produced, for example, by dissolving or dispersing an organic material, such as a polyimide or epoxy resin and optionally, a material, for example, an additive such as a metallic filler, in an organic solvent to form a coating varnish, coating the coating varnish onto a carrier film such as a biaxially-stretched poly-propylene film, causing the solvent to evaporate to form a layer and then peeling off the layer from the carrier film. One side of the layer, the side having been in contact with the air in a drying step in which the solvent was caused to evaporate (i.e., the side being a side opposite to a side where the layer was in contact with the carrier film), will be referred to as the "side A", while the side at which the layer was in contact with the carrier film will be referred to as the "side B". If the film-shaped organic die-bonding material is laminated by the laminating method of the present invention so that the side A is brought into contact with the support member, a semiconductor device fabricated using the laminating method can avoid occurrence of reflow cracking, thereby making it possible to provide the thus-fabricated an extremely reliable semiconductor device.

In the invention, use of the following film-shaped organic die-bonding material can avoid occurrence of reflow cracking and is more preferred for the fabrication of an extremely reliable semiconductor device:

(1) a film-shaped organic die-bonding material having a water absorption rate not greater than 1.5 vol. %;

(2) a film-shaped organic die-bonding material having a saturation moisture absorption rate not greater than 1.0 vol. %;

(3) a film-shaped organic die-bonding material having a residual volatile content not greater than 3.0 wt. %;

(4) a film-shaped organic die-bonding material having surface energy of at least 40 erg/cm$^2$;

(5) a film-shaped organic die-bonding material containing voids in a void volume not greater than 10% within the die-bonding material and an interface between the die-bonding material and an associated support member in a stage of bonding a chip on the support member; or (6) a film-shaped organic die-bonding material having peeling strength of at least 0.5 kgf/5×5 mm chip at a stage when a chip has been bonded on an associated support member.

The following film-shaped organic die-bonding materials can be produced by adjusting the composition of a film-shaped organic die-bonding, for example, the structure of a polymer such as a polyimide or the content of a filler such as silver:

(1) a film-shaped organic die-bonding material having a water absorption rate not greater than 1.5 vol. %;

(2) a film-shaped organic die-bonding material having a saturation moisture absorption rate not greater than 1.0 vol. %;

(4) a film-shaped organic die-bonding material having surface energy of at least 40 erg/cm$^2$; and (6) a film-shaped organic die-bonding material having peeling strength of at least 0.5 kgf/5×5 mm chip at the stage when the chip has been bonded on an associated support member.

The following film-shaped organic die-bonding materials can be produced by adjusting their production conditions, for example, the drying temperature, the drying time and/or the like:

(3) a film-shaped organic die-bonding material having a residual volatile content not greater than 3.0 wt. %; and (5) a film-shaped organic die-bonding material containing voids in the void volume not greater than 10% within the die-bonding material and the interface between the die-bonding material and the associated support member in the stage of bonding the chip on the support member.

According to the present invention, the film-shaped organic die-bonding material can be provided with two or more of the above-described physical properties and characteristic properties.

As physical properties or characteristic properties which are preferred to be provided, the followings can be mentioned by way of example:

(A) a film-like organic die-bonding materials having a saturation moisture absorption rate not greater than 1.0 vol. % and a residual volatile content not greater than 3.0 wt. %;

(B) a film-like organic die-bonding materials having a saturation moisture absorption rate not greater than 1.0 vol. % and peeling strength of at least 0.5 kgf/5×5 mm chip at a stage when a chip has been bonded on an associated support member;

(C) a film-like organic die-bonding materials having a residual volatile content not greater than 3.0 wt. % and peeling strength of at least 0.5 kgf/5×5 mm chip at a stage when a chip has been bonded on an associated support member; and (D) a film-like organic die-bonding material having a saturation moisture absorption rate not greater than 1.0 vol. %, a residual volatile content not greater than 3.0 wt. % and peeling strength of at least 0.5 kgf/5×5 mm chip at a stage when a chip has been bonded on an associated support member.

BEST MODE FOR CARRYING OUT THE INVENTION

EXAMPLE 1

Figure 1:
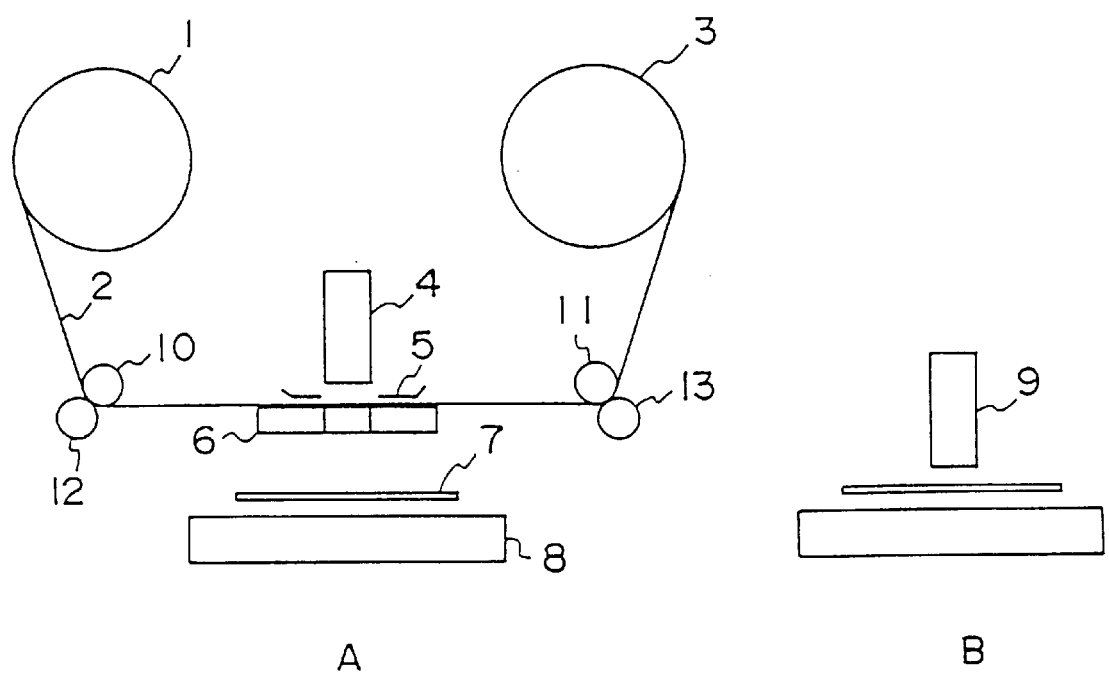
FIG. 1 is a simplified front view of one embodiment of a laminating machine according to the present invention.
Figure 2:
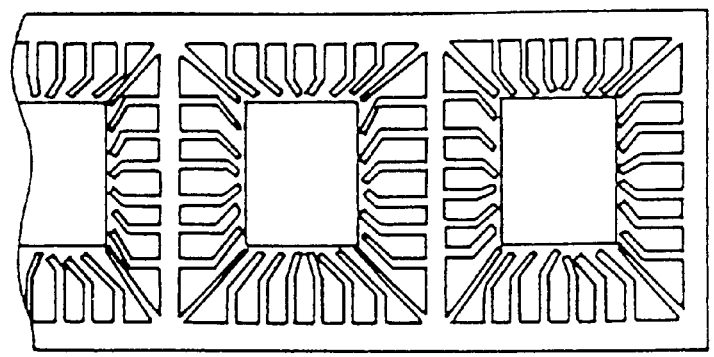
FIG. 2 is a plan view of a leadframe.
Figure 3:
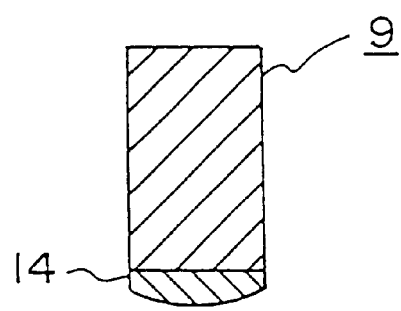
FIG. 3 is a cross-sectional view showing one example of compression-bonding elements.
Figure 4:
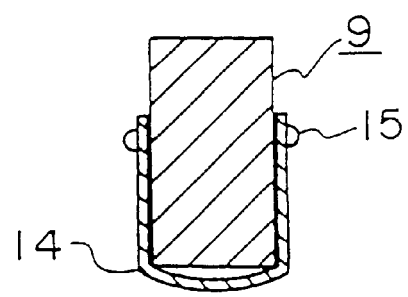
FIG. 4 is a cross-sectional view illustrating another example of compression-bonding elements.
Figure 5:
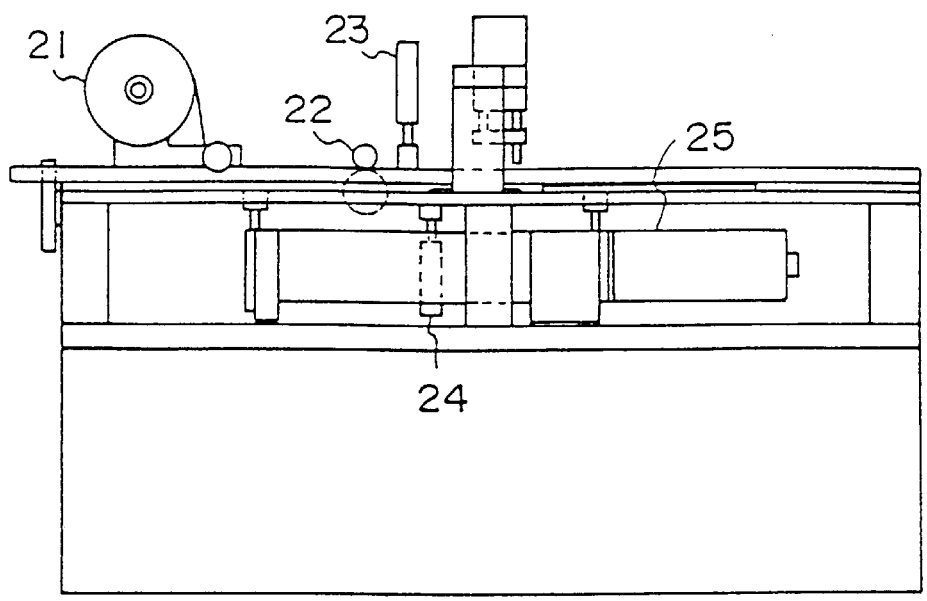
FIG. 5 is a front view of one embodiment of a die-bonding apparatus according to the present invention.
Figure 6:
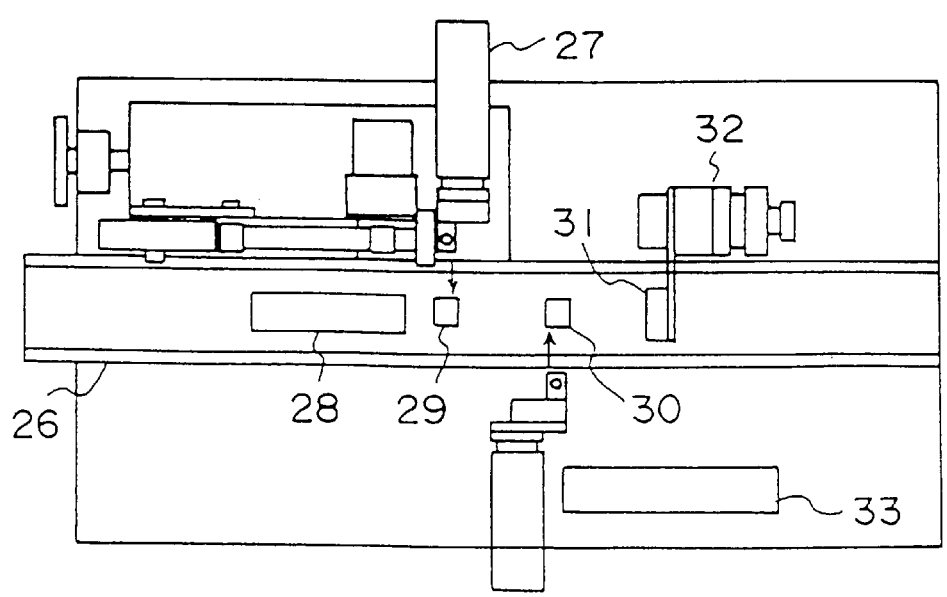
FIG. 6 is a plan view of the one embodiment of the die-bonding apparatus according to the present invention.
Figure 7:
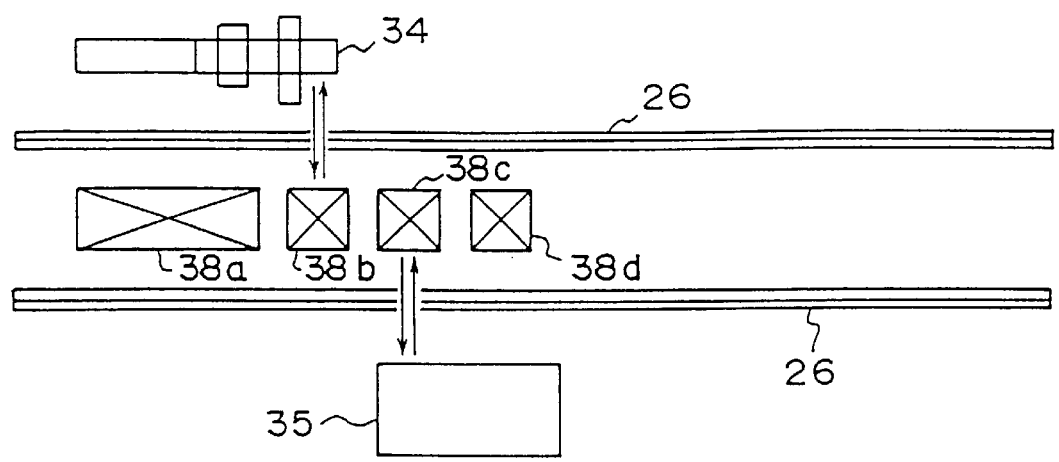
FIG. 7 is a simplified plan view of frame-transporting rails.
Figure 8:
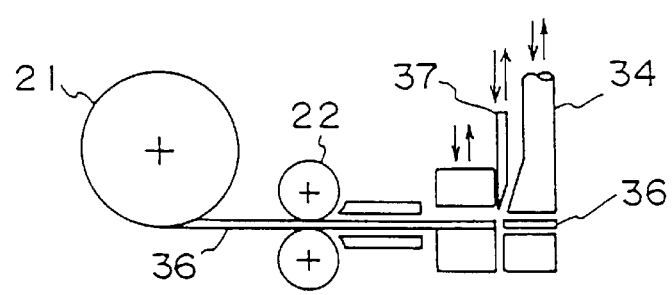
FIG. 8 is a simplified side view of a feeder and a cutter.
Figure 9:
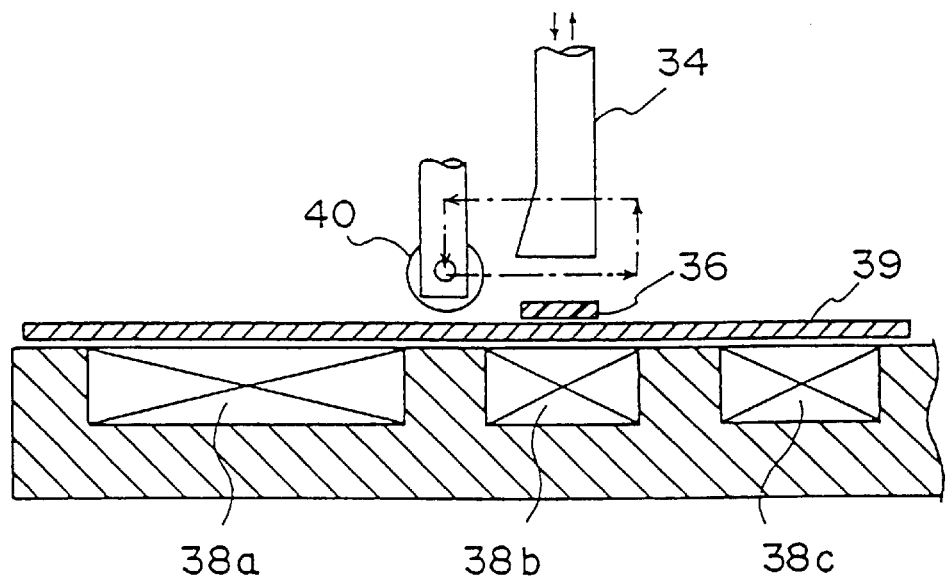
FIG. 9 is a simplified cross-sectional view of a film compression-bonding device.
Figure 10:
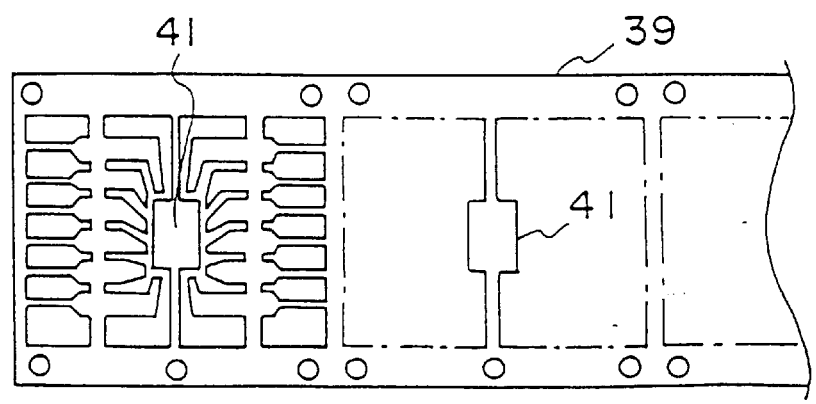
FIG. 10 is a plan view of a leadframe.

The leadframe shown in FIG. 2 was placed on the travelling table 8 shown in FIG. 1, and was then moved to the position A. The leadframe on the travelling table had been heated to 180° C. by the heating unit built into the travelling table. A die-bonding film was made of a polyimide resin containing silver powder as a main filler and was 10 mm in width, 40 μm in thickness and 5 m in length. The reel 1 of 100 mm in diameter with the film wound thereon was set at the feed unit, and the film 2 was fed out by the constant tension roller 10 and the feed roller 11 so that a tension of 1 MPa was applied to the tape. Next, the film was held in place by the film-fixing punch 5 and then punched out by the punch 4 and the die 6. The punched-out film was suction-held by the vacuum suction arranged in the punch 4. The punch 4 was provided with two suction-holding ports of 1.2 mm in diameter. This punch 4 descended further and, after provisional compression-bonding of the film on the die pad on the leadframe, the vacuum suction-holding was canceled, the punch 4 was caused to ascend. Then, the film 2 was fed out over 12 mm by the take-up reel 3. The travelling table was caused to move over 20 mm which was equal to a pitch between chips. In this state, the film 2 was punched again to achieve provisional compression-bonding. These operations were conducted 5 times so that films were provisionally compression-bonded on all the die pads on the leadframe. Subsequent to the completion of the provisional compression-bonding, the leadframe was moved to the position B by the travelling table. At the position B, the film was compression-bonded at a pressure of 0.8 MPa by the compression-bonding element illustrated in FIG. 3. The compression-bonding element in FIG. 3 had been formed by forming a piece of silicone rubber, an elastomer, into a slightly convex shape at a center thereof and fixing it to an end face of the compression-bonding element. By usual methods, each chip of 10×15 mm was heated and compression-bonded on the thus compression-bonded bonding film, followed by hardening at 250° C. Four leadframes, each of which carried five chips mounted thereon, were evaluated for voids by soft X rays. No voids were observed.

COMPARATIVE EXAMPLE 1

A silver paste which had been used conventionally was coated on each die pad employed in the Example. By usual methods, a chip of 10×15 mm was next heated and compression-bonded, followed by hardening at 250° C. Four leadframes each of which carried five chips mounted thereon were evaluated for voids by soft X rays. Voids of 1 mm or smaller were observed in three of the chips, and voids of 0.5 mm or smaller were observed in six of the chips.

EXAMPLES 2 TO 7, COMPARATIVE EXAMPLES 2 TO 5

An organic solvent (280 g) was added to 100 g of a polyimide and 10 g of an epoxy resin to dissolve the polyimide and the epoxy resin. 74 g of silver powder were added to the resultant solution. The mixture so obtained was stirred thoroughly to uniformly disperse the silver powder, whereby a coating varnish was prepared. The coating varnish was coated on a carrier film (a biaxially-stretched polypropylene film). The thus-coated film was heated at 120° C. for 75 minutes in a heating furnace so that the solvent was caused to evaporate to dry the coated varnish into a die-bonding film. A side which was in contact with the air in that drying step will be referred to as the "side A", while a side which was in contact with the carrier film will be referred to as the "side B".

The die-bonding film was bonded to a tab of a leadframe. When the die-bonding film was bonded with the side A facing the leadframe and the side B positioned on a side facing air, good bonding was performed without the occurrence of voids at an interface between the die-bonding film and the leadframe and at the die-bonding film itself. For the bonding, a compression-bonding element was employed whose tip comprises an elastic body configured at a surface thereof to define a curved convex surface.

Interfacial voids were observed and evaluated by visual observation. Voids inside each film were evaluated by casting a sample with a polyester resin, cutting the sample with a diamond cutter, and observing a cut surface through a microscope.

Each chip was mounted at a temperature of 220° C. under a load of 200 g for a time of 5 seconds on each film-bonded leadframe. Molding was conducted using a sealing material, whereby a semiconductor device was fabricated.

After the sealing, the sample was left to stand for 168 hours in an air-conditioned chamber of 85° C. and 85% RH and was then heated at 240° C. for 10 seconds in an IR reflow furnace. After that, the sample was cast with a polyester resin and was then cut by a diamond cutter. A cut surface was observed through a microscope to count the number of reflow cracks that occurred, whereby the reflow cracking resistance was evaluated. The results of the evaluation of reflow cracking resistance are presented in Table 1.

TABLE 1

|  | Leadframe-side, bonded side | Bonding temp. (° C.) | Bonding load (kgf) | Bonding time (sec) | Voids | Number of reflow cracks occurred |
|---|---|---|---|---|---|---|
| Example 2 | Side A | 160 | 4 | 5 | None | 0/10 |
| Example 3 | Side A | 165 | 4 | 5 | None | 0/10 |
| Example 4 | Side A | 170 | 4 | 5 | None | 0/10 |
| Example 5 | Side A | 160 | 1 | 5 | None | 0/10 |
| Example 6 | Side A | 165 | 1 | 5 | None | 0/10 |
| Example 7 | Side A | 170 | 1 | 5 | None | 0/10 |
| Comp. Ex. 2 | Side B | 160 | 4 | 5 | Formed | 5/10 |
| Comp. Ex. 3 | Side B | 170 | 4 | 5 | Formed | 4/10 |
| Comp. Ex. 4 | Side B | 160 | 1 | 5 | Formed | 6/10 |
| Comp. Ex. 5 | Side B | 170 | 1 | 5 | Formed | 5/10 |

EXAMPLE 8

An organic solvent (280 g) was added to 100 g of a polyimide (a polyimide synthesized from bistrimellitic acid anhydride and an aromatic diamine; product of Hitachi Chemical Co., Ltd.) and 10 g of an epoxy resin to dissolve the polyimide and the epoxy resin. A predetermined amount of silver powder was added to the resulting solution. The mixture so obtained was stirred thoroughly to uniformly disperse the silver powder, whereby a coating varnish was prepared.

The coating varnish was coated on a carrier film ("OPP Film", biaxially-stretched polypropylene). The thus-coated film was heated in a circulating hot air dryer so that the solvent was caused to evaporate to dry the coated varnish. A film-shaped organic die-bonding material of the composition and water absorption rate shown in Table 2 was hence produced.

Figure 11:
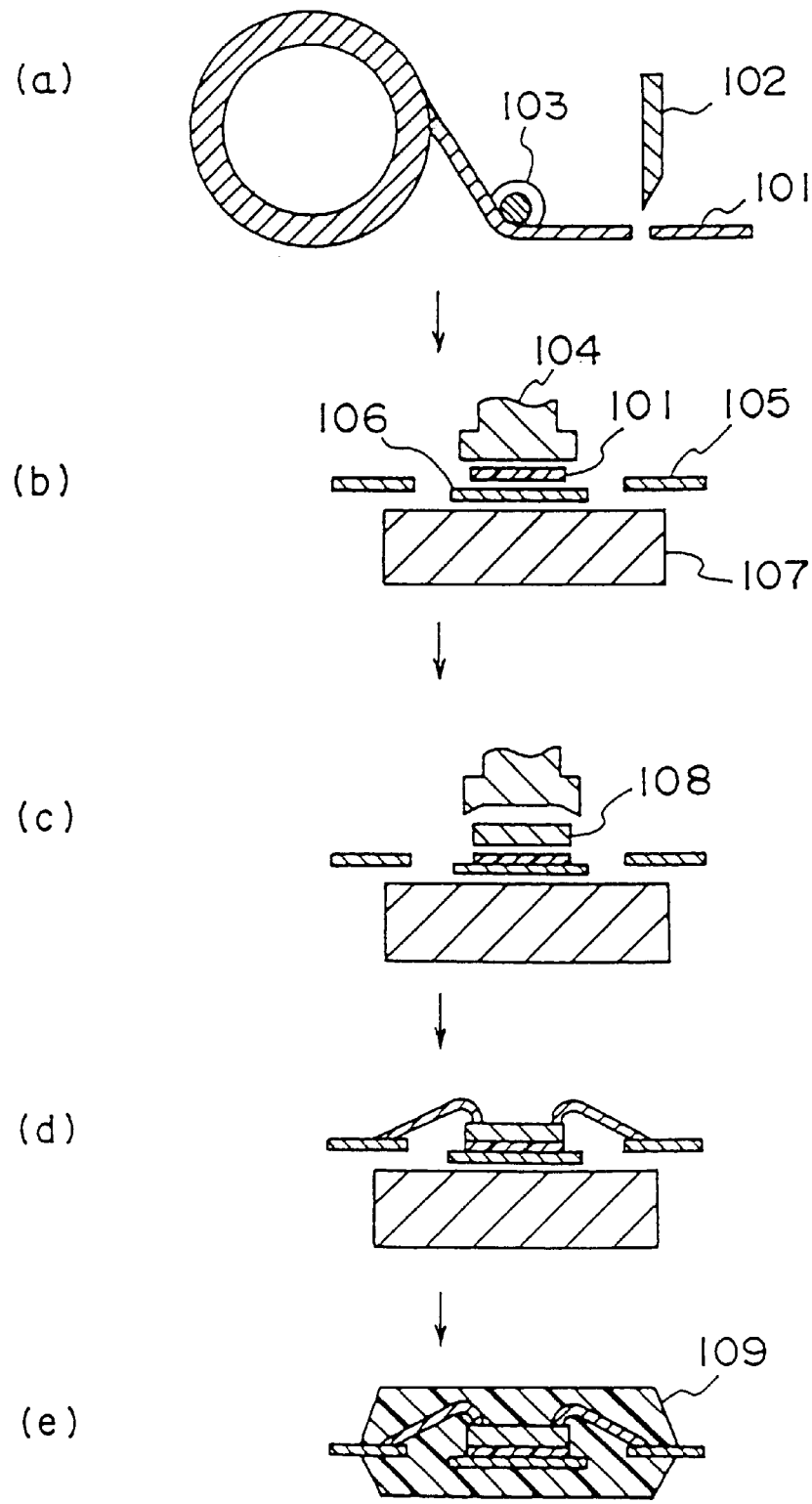
FIG. 11 is a cross-sectional view showing one example of a process according to the present invention for the fabrication of a semiconductor device.
Figure 12:
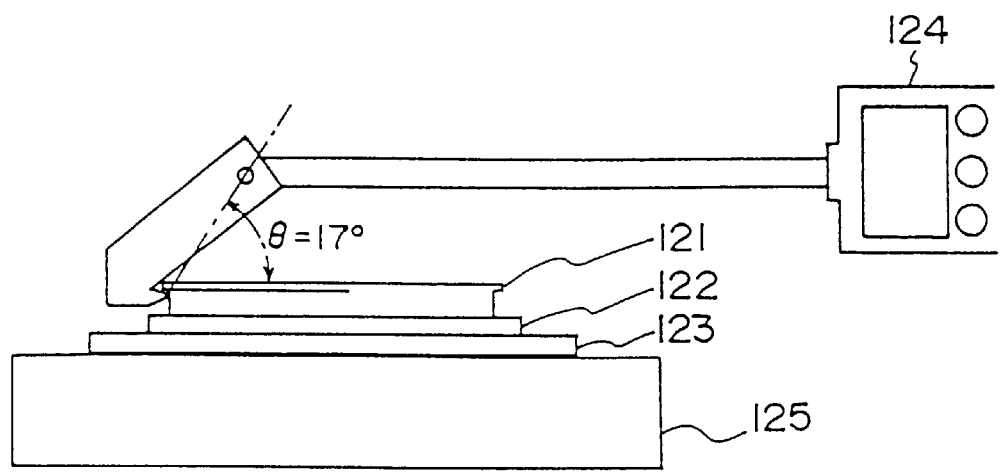
FIG. 12 is a front view illustrating a method for measuring peeling strength by using a push-pull gauge.

As is illustrated in FIG. 11, the film-shaped organic die-bonding material shown in Table 2 was heated at 160° C. and bonded on a tab of a leadframe. On the leadframe with the film-shaped organic die-bonding material bonded thereon, chips were mounted at a temperature of 300° C. under a load of 1000 g for a time of 5 seconds. Wire bonding was conducted, followed by molding with a sealing material ("CEL-9000", trade name; product of Hitachi Chemical Co., Ltd.) to fabricate a semiconductor device (QFP package: 14×20×1.4 mm, chip size: 8×10 mm, 42 alloy leadframe).

After the sealing, the semiconductor device was left to stand for 168 hours in an air-conditioned chamber of 85° C. and 85% RH and was then heated at 240° C. for 10 seconds in an IR reflow furnace.

After that, the semiconductor device was cast with a polyester resin and was then cut by a diamond cutter. A cut surface was observed through a microscope. An occurrence rate (%) of reflow cracks was determined by the following formula to evaluate the reflow cracking resistance.

(The number of reflow cracks occurred/the number of chips tested)×100 occurrence rate (%) of reflow cracks The evaluation results are presented in Table 2.

TABLE 2

| | Film composition | | Water | Occurrence rate |
|---|---|---|---|---|
| No. | Polyimide | Ag content (wt. %) | absorption rate (%) | of reflow cracks (%) |
| 1 | Polyimide A | 80 | 2.0 | 100 |
| 2 | Polyimide B | 52 | 1.5 | 0 |
| 3 | Polyimide C | 0 | 1.0 | 0 |

Method of Measuring Water Absorption Rate

A film of 50×50 mm in size was used as a sample. The sample was dried at 120° C. for 3 hours in a vacuum dryer. After the thus-dried sample was allowed to cool down in a desiccator, its dry weight was measured and recorded as M1. The sample was immersed at room temperature for 24 hours in distilled water and was then taken out. The sample was wiped off at surfaces thereof with filter paper, and was then promptly weighed and recorded as M2.

$$[(M2-M1)/(M1/d)] \times 100 = \text{water absorption rate (vol. \%)}$$

A water absorption rate was calculated in accordance with the above formula. Letter d indicates the density of the film-shaped organic die-bonding material.

EXAMPLE 9

An organic solvent (280 g) was added to 100 g of a polyimide (a polyimide synthesized from bistrimellitic acid anhydride and an aromatic diamine; product of Hitachi Chemical Co., Ltd.) and 10 g of an epoxy resin to dissolve the polyimide and the epoxy resin. The resulting solution was added with a predetermined amount of silver powder. The mixture so obtained was stirred thoroughly to uniformly disperse the silver powder, whereby a coating varnish was prepared.

The coating varnish was coated on a carrier film ("OPP Film", biaxially-stretched polypropylene). The thus-coated film was heated in a circulating hot air dryer so that the solvent was caused to evaporate to dry the coated varnish. A film-shaped organic die-bonding material of the composition and saturation moisture absorption rate shown in Table 3 was hence produced.

As is illustrated in FIG. 11, the film-shaped organic die-bonding material shown in Table 3 was heated at 160° C. and bonded on a tab of a leadframe. On the leadframe with the film-shaped organic die-bonding material bonded thereon, chips were mounted at a temperature of 300° C. under a load of 1000 g for a time of 5 seconds. Wire bonding was conducted, followed by molding with a sealing material ("CEL-9000", trade name; product of Hitachi Chemical Co., Ltd.) to fabricate a semiconductor device (QFP package: 14×20×1.4 mm, chip size: 8×10 mm, 42 alloy leadframe).

After the sealing, the semiconductor device was left to stand for 168 hours in an air-conditioned chamber of 85° C. and 85% RH and was then heated at 240° C. for 10 seconds in an IR reflow furnace.

After that, the semiconductor device was cast with a polyester resin and was then cut by a diamond cutter. A cut surface was observed through a microscope. An occurrence rate (%) of reflow cracks was determined by the following formula to evaluate the reflow cracking resistance.

(The number of reflow cracks occurred/the number of chips tested)×100=occurrence rate (%) of reflow cracks The evaluation results are presented in Table 3.

TABLE 3

| | Film composition | | Saturation moisture | Occurrence rate |
|---|---|---|---|---|
| No. | Polyimide | Ag content (wt. %) | absorption rate (%) | of reflow cracks (%) |
| 1 | Polyimide D | 80 | 1.5 | 100 |
| 2 | Polyimide B | 80 | 1.0 | 0 |
| 3 | Polyimide E | 0 | 0.5 | 0 |

Method of Measuring Saturation Moisture Absorption Rate

A circular, film-shaped organic die-bonding material of 100 mm in diameter was used as a sample. The sample was dried at 120° C. for 3 hours in a vacuum dryer. After the thus-dried sample was allowed to cool down in a desiccator, its dry weight was measured and recorded as M1. The sample was allowed to absorb moisture in an air-conditioned chamber of 85° C. and 85% RH. The sample was taken out of the chamber, and was then promptly weighed. When the thus-weighed value became constant, that weight was recorded as M2.

$$[M2-M1)/(M1/d] \times 100 = \text{saturation moisture absorption rate (vol. \%)}$$

A saturation moisture absorption rate was calculated in accordance with the above formula. Letter d indicates the density of the film-shaped organic die-bonding material.

EXAMPLE 10

Dimethylacetamide (140 g) and cyclohexanone (140 g) were added as solvents to 100 g of a polyimide (a polyimide synthesized from bistrimellitic acid anhydride and an aromatic diamine; product of Hitachi Chemical Co., Ltd.) and 10 g of an epoxy resin to dissolve the polyimide and the epoxy resin. To the resulting solution, 74 g of silver powder was added. The mixture so obtained was stirred thoroughly to uniformly disperse the silver powder, whereby a coating varnish was prepared.

The coating varnish was coated on a carrier film ("OPP Film", biaxially-stretched polypropylene). The thus-coated film was heated to 80° C. to 120° C. in a circulating hot air dryer so that the solvents were caused to evaporate to dry the coated varnish. A die-bonding film of the residual volatile content shown in Table 4 was hence produced. If the drying temperature is higher than 120° C., the coated varnish is dried at 80° C. for 30 minutes on the OPP film and the resulting film-shaped organic die-bonding material is peeled off from the OPP film. After fixedly pinching the die-bonding material on an iron frame, the die-bonding material is heated again in a dryer to dry it up.

As is illustrated in FIG. 11, the film-shaped organic die-bonding material shown in Table 5 was heated at 160° C. and bonded on a tab of a leadframe. On the leadframe with the film-shaped organic die-bonding material bonded thereon, chips were mounted at a temperature of 300° C. under a load of 1000 g for a time of 5 seconds. Wire bonding was conducted, followed by molding with a sealing material ("CEL-9000", trade name; product of Hitachi Chemical Co., Ltd.) to fabricate a semiconductor device (QFP package: 14×20×1.4 mm, chip size: 8×10 mm, 42 alloy leadframe).

After the sealing, the semiconductor device was left to stand for 168 hours in an air-conditioned chamber of 85° C. and 85% RH and was then heated at 240° C. for 10 seconds in an IR reflow furnace.

After that, the semiconductor device was cast with a polyester resin and was then cut by a diamond cutter. A cut surface was observed through a microscope. An occurrence rate (%) of reflow cracks was determined by the following formula to evaluate the reflow cracking resistance.

(The number of reflow cracks occurred/the number of chips tested)×100=occurrence rate (%) of reflow cracks The evaluation results are presented in Table 4

TABLE 4

| Sample No. | Drying temp. (° C.) | Drying time (min) | Residual volatile content (wt. %) | Voids in film | Occurrence rate of reflow cracks (%) |
|---|---|---|---|---|---|
| 1 | 100 | 2 | 4.9 | Formed | 100 |
| 2 | 100 | 30 | 3.5 | Formed | 60 |
| 3 | 120 | 10 | 2.9 | None | 0 |
| 4 | 160 | 10 | 1.5 | None | 0 |

Method of Measuring Residual Volatile Content

A film-shaped organic die-bonding material of 50×50 mm in size was used as a sample. The weight of the sample was measured and was recorded as M1. After drying the sample at 200° C. for 2 hours in a circulating hot air constant-temperature chamber, its weight was measured and was recorded as M2.

$[(M2-M1)/M1] \times 100$ = residual volatile content (wt. %)

EXAMPLE 11

An organic solvent (280 g) was added to 100 g of a polymide (a polyimide synthesized from bistrimellitic acid anhydride and an aromatic diamine; product of Hitachi Chemical Co., Ltd.) and 10 g of an epoxy resin to dissolve the polyimide and the epoxy resin. The resulting solution was added with a predetermined amount of silver powder. The mixture so obtained was stirred thoroughly to uniformly disperse the silver powder, whereby a coating varnish was prepared.

The coating varnish was coated on a carrier film ("OPP FILM", biaxially-stretched polypropylene). The thus-coated film was heated in a circulating hot air dryer so that the solvent was caused to evaporate to dry the coated varnish. A film-shaped organic die-bonding material of the composition and surface energy shown in Table 5 was hence produced.

As is illustrated in FIG. 11, the film-shaped organic die-bonding material shown in Table 5 was heated at 160° C. and bonded on a tab of a leadframe. On the leadframe with the film-shaped organic die-bonding material bonded thereon, chips were mounted at a temperature of 300° C. under a load of 1000 g for a time of 5 seconds. Wire bonding was conducted, followed by molding with a sealing material ("CEL-9000", trade name; product of Hitachi Chemical Co., Ltd.) to fabricate a semiconductor device (QFP package: 14×20×1.4 mm, chip size: 8×10 mm, 42 alloy leadframe).

After the sealing, the semiconductor device was left to stand for 168 hours in an air-conditioned chamber of 85° C. and 85% RH and was then heated at 240° C. for 10 seconds in an IR reflow furnace.

After that, the semiconductor device was cast with a polyester resin and was then cut by a diamond cutter. A cut surface was observed through a microscope. An occurrence rate (%) of reflow cracks was determined by the following formula to evaluate the reflow cracking resistance.

(The number of reflow cracks occurred/the number of chips tested)×100=occurrence rate (%) of reflow cracks The evaluation results are presented in Table 5.

TABLE 5

| | Film composition | | Surface | Occurrence rate |
|---|---|---|---|---|
| No. | Polyimide | Ag content (wt. %) | energy (erg/cm$^2$) | of reflow cracks (%) |
| 1 | Polyimide B | 85 | 39 | 100 |
| 2 | Polyimide B | 60 | 41 | 0 |
| 3 | Polyimide E | 0 | 45 | 0 |

Method of Measuring Surface Energy

Contact angles of water and diiodomethane to a surface of a film-shaped organic die-bonding material were measured using a contact angle meter. From the contact angles of water and diiodomethane so measured, surface energy was calculated using the geometric mean method in accordance with a formula shown below as Formula 1.

$$\gamma_s = \gamma_s^p + \gamma_s^d$$

$$36.4(1+\cos \theta^H) = (21.8\gamma_s^d)^{1/2} + (51.0\gamma_s^p)^{1/2}$$

$$25.4(1+\cos \theta^I) = (48.5\gamma_s^d)^{1/2} + (2.3\gamma_s^p)^{1/2} \qquad \text{Formula 1}$$

$\gamma_s$: surface energy
$\gamma_s^p$: polar component of surface energy
$\gamma_s^d$: dispersive component of surface energy $θ^H$: contact angle of water to a solid surface $θ^I$: contact angle of diiodomethane to the solid surface

EXAMPLE 12

Dimethylacetamide (140 g) and cyclohexanone (140 g) were as solvents to 100 g of a polyimide (a polyimide synthesized from bistrimellitic acid anhydride and an aromatic diamine; product of Hitachi Chemical Co., Ltd.) and 10 g of an epoxy resin to dissolve the polyimide and the epoxy resin. 74 g of silver powder was added to the resulting solution. The mixture so obtained was stirred thoroughly to uniformly disperse the silver powder, whereby a coating varnish was prepared.

The coating varnish was coated on a carrier film ("OPP Film", biaxially-stretched polypropylene). The thus-coated film was heated to 80° C. to 120° C. in a circulating hot air dryer so that the solvents were caused to evaporate to dry the coated varnish. A die-bonding material of the void volume shown in Table 6 was hence produced.

If the drying temperature is higher than 120° C., the coated varnish is dried at 80° C. for 30 minutes on the OPP film and the resulting film-shaped organic die-bonding material is peeled off from the OPP film. After fixedly pinching the die-bonding material on an iron frame, the die-bonding material is heated again in a dryer to dry it.

The term "void volume" as used herein means the volume rate of voids within a die-bonding material and an interface between the die-bonding material and an associated support member in the stage of bonding the chip on the support member.

As is illustrated in FIG. 11, the film-shaped organic die-bonding material shown in Table 5 was heated at 160° C. and bonded on a tab of a leadframe. On the leadframe with the film-shaped organic die-bonding material bonded thereon, chips were mounted at a temperature of 300° C. under a load of 1000 g for a of 5 seconds. Wire bonding was conducted, followed by molding with a sealing material ("CEL-9000", trade name; product of Hitachi Chemical Co., Ltd.) to fabricate a semiconductor device (QFP package: 14×20×1.4 mm, chip size: 8×10 mm, 42 alloy leadframe).

After the sealing, the semiconductor device was left to stand for 168 hours in an air-conditioned chamber of 85° C. and 85% RH and was then heated at 240° C. for 10 seconds in an IR reflow furnace.

After that, the semiconductor device was cast with a polyester resin and was then cut by a diamond cutter. A cut surface was observed through a microscope. An occurrence rate (%) of reflow cracks was determined by the following formula to evaluate the reflow cracking resistance.

(The number of reflow cracks occurred/the number of chips tested)×100=occurrence rate (%) of reflow cracks The evaluation results are presented in Table 6.

TABLE 6

| Sample No. | Drying temperature (° C.) | Drying time (min) | Void volume (%) | Occurrence rate of reflow cracks (%) |
|---|---|---|---|---|
| 1 | 80 | 30 | 30 | 100 |
| 2 | 100 | 10 | 17 | 80 |
| 3 | 120 | 10 | 10 | 0 |
| 4 | 140 | 10 | 5 | 0 |

Method of Measuring Void Volume

A leadframe and a silicon chip were bonded together via a film-shaped organic die-bonding material to prepare a sample. Using a soft X-ray apparatus, an image of the sample viewed downwardly was radiographed. The area percentage of voids in the resultant picture was measured by an image analysis system. The area percentage of the voids as viewed downwardly through the upper wall was recorded as a void volume (%).

EXAMPLE 13

An organic solvent (280 g) was added to 100 g of a polyimide (a polyimide synthesized from bistrimellitic acid anhydride and an aromatic diamine; product of Hitachi Chemical Co., Ltd.) and 10 g of an epoxy resin to dissolve the polyimide and the epoxy resin. A predetermined amount of silver powder was added to the resulting solution. The mixture so obtained was stirred thoroughly to uniformly disperse the silver powder, whereby a coating varnish was prepared.

The coating varnish was coated on a carrier film ("OPP Film", biaxially-stretched polypropylene). The thus-coated film was heated in a circulating hot air dryer so that the solvent was caused to evaporate to dry the coated varnish. A film-shaped organic die-bonding material of the composition and peel strength shown in Table 6 was hence produced.

The term "peel strength" as used herein means the peel strength of a film-shaped organic die-bonding material at the stage when a chip has been bonded on a support member via the film-shaped organic die-bonding material.

As is illustrated in FIG. 11, the film-shaped organic die-bonding material shown in Table 7 was heated at 160° C. and bonded on a tab of a leadframe. On the leadframe with the film-shaped organic die-bonding material bonded thereon, chips were mounted at a temperature of 300° C. under a load of 1000 g for a time of 5 seconds. Wire bonding was conducted, followed by molding with a sealing material ("CEL-9000", trade name; product of Hitachi Chemical Co., Ltd.) to fabricate a semiconductor device (QFP package: 14×20×1.4 mm, chip size: 8×10 mm, 42 alloy leadframe).

After the sealing, the semiconductor device was left to stand for 168 hours in an air-conditioned chamber of 85° C. and 85% RH and was then heated at 240° C. for 10 seconds in an IR reflow furnace.

After that, the semiconductor device was cast with a polyester resin and was then cut by a diamond cutter. A cut surface was observed through a microscope. An occurrence rate (%) of reflow cracks was determined by the following formula to evaluate the reflow cracking resistance.

(The number of reflow cracks occurred/the number of chips tested)×100=occurrence rate (%) of reflow cracks The evaluation results are presented in Table 7.

TABLE 7

| No. | Film composition Polyimide | Ag content (wt. %) | Peel strength (kgf/5 × 5 mm chip) | Occurrence rate of reflow cracks (%) |
|---|---|---|---|---|
| 1 | Polyimide D | 80 | 0.2 | 100 |
| 2 | Polyimide A | 80 | 0.4 | 80 |
| 3 | Polyimide B | 80 | 0.5 | 0 |
| 4 | Polyimide E | 30 | 1.0 | 0 |
| 5 | Polyimide E | 40 | >2.0 | 0 |

Method of Measuring Peel Strength

A support member for supporting a chip, such as tab surface of a leadframe, with a silicon chip (test piece) of 5×5 mm in size bonded with a film-shaped organic die-bonding material interposed therebetween was held for 20 seconds on a heating platen of 240° C. As is shown in FIG. 13, the peel strength was measured at a testing speed of 0.5 mm/min by using a push-pull gauge. Illustrated in FIG. 13 are the chip at 121, the film-shaped organic die-bonding material at 122, the leadframe at 123, the push-pull gauge at 124 and the heating platen at 125. Incidentally, the measurement was conducted by holding the leadframe at 240° C. for 20 seconds. If a chip-mounting temperature is different because of the application purpose of the resulting semiconductor device, the measurement should be conducted holding such a leadframe at that chip-mounting temperature.

EXAMPLE 14

An organic solvent (280 g) was added to 100 g of a polyimide (a polyimide synthesized from bistrimellitic acid anhydride and an aromatic diamine; product of Hitachi Chemical Co., Ltd.) and 10 g of an epoxy resin to dissolve the polyimide and the epoxy resin. 74 g of silver powder was added to the resulting solution. The mixture so obtained was stirred thoroughly to uniformly disperse the silver powder, whereby a coating varnish was prepared.

The coating varnish was coated on a carrier film ("OPP Film", biaxially-stretched polypropylene). The thus-coated film was heated in a circulating hot air dryer so that the solvent was caused to evaporate to dry the coated varnish.

As is illustrated in FIG. 11, the film-shaped organic die-bonding material was heated at 1600C and bonded on a tab of a leadframe. Chips were mounted on the leadframe with the film-shaped organic die-bonding material bonded thereon at a temperature of 300° C. under a load of 1000 g for a time of 5 seconds. Here, the film-shaped organic die-bonding material of the size indicated in Table 7 was used. Wire bonding was next conducted, followed by molding with a sealing material ("CEL-9000", trade name; product of Hitachi Chemical Co., Ltd.) to fabricate a semiconductor device (QFP package: 14×20×1.4 mm, chip size: 8×10 mm, 42 alloy leadframe).

After the sealing, the semiconductor device was left to stand for 168 hours in an air-conditioned chamber of 85° C. and 85% RH and was then heated at 240° C. for 10 seconds in an IR reflow furnace.

After that, the semiconductor device was cast with a polyester resin and was then cut by a diamond cutter. A cut surface was observed through a microscope. An occurrence rate (%) of reflow cracks was determined by the following formula to evaluate the reflow cracking resistance.

(The number of reflow cracks occurred/the number of chips tested)×100=occurrence rate (%) of reflow cracks The evaluation results are presented in Table 8.

TABLE 8

| Sample No. | Film size (mm × mm) | Film area (mm$^2$) | Chip size (mm × mm) | Chip area | Protrusion (mm$^2$) | Occurrence rate of reflow cracks (%) |
|---|---|---|---|---|---|---|
| 1 | 9 × 11 | 99 | 8 × 10 | 8 | Formed | 100 |
| 2 | 8 × 11 | 88 | 8 × 10 | 80 | Formed | 60 |
| 3 | 8 × 10 | 80 | 8 × 10 | 80 | None | 0 |
| 4 | 5 × 7 | 35 | 8 × 10 | 80 | None | 0 |
| 5 | 2 × 4 | 8 | 8 × 10 | 80 | None | 0 |

As has been described above, use of the method, machine and/or apparatus of the present invention makes it possible to compression-bond a film-shaped organic die-bonding material having good bonding properties on a support member such as a leadframe without voids while achieving good productivity. A semiconductor device fabricated using the method, machine and/or apparatus of the present invention can avoid package cracking upon being mounted.

Further, the semiconductor device according to the present invention can prevent the occurrence of reflow cracking upon performing reflow soldering to mount the semiconductor device.

What is claimed is:

1. A material comprising an organic die-bonding film having a surface energy of at least 40 erg/cm$^2$ and a residual volatile component in an amount of not more than 3.0% by weight.

2. A material according to claim 1, said film having a water absorption of 1.5% by volume or less.

3. A material according to claim 1, said film having a saturation moisture absorption of 1.0% by volume or less.

4. A material according to claim 3, said film having a residual volatile component in an amount of not more than 3.0% by weight.

5. A material according to claim 1, said film having a peel strength of 0.5 kgf/5 mm×5 mm chip or higher when a semiconductor has been bonded to a support member using said material.

6. A material according to claim 3, said film having a peel strength of 0.5 kgf/5 mm×5 mm chip or higher when a semiconductor has been bonded to a support member with said material.

7. A material according to claim 1, said film having a peel strength of 0.5 kgf/5 mm×5 mm chip or higher when a semiconductor has been bonded to a support member with said material.

8. A material according to claim 4, said film having a peel strength of 0.5 kgf/5 mm×5 mm chip or higher when a semiconductor has been bonded to a support member with said material.

9. A material according to claim 1, said film having a void volume of 10% or less in terms of voids present in the material and at an interface between said material and a support member when a semiconductor has been bonded to said support member.

10. A material according to claim 1, said film comprising at least one component selected from an epoxy resin and a polyimide resin.

11. A material according to claim 1, further comprising a metal filler.

12. A material according to claim 11, said metal filler comprising a silver.

13. A material according to claim 1, further comprising an inorganic filler.

14. A semiconductor device, comprising:

a semiconductor chip;

a support; and an organic die bonding film having a surface energy of at least 40 erg/cm$^2$ bonding the semiconductor chip to the support.

15. A semiconductor device according to claim 14, wherein said film has a water absorption of 1.5% by volume or less.

16. A semiconductor device according to claim 14, wherein said film has a saturation moisture absorption of 1.0% or less.

* * * * *